(12) United States Patent
Schemmann et al.

(10) Patent No.: US 7,948,416 B2
(45) Date of Patent: May 24, 2011

(54) DIGITAL TO ANALOG CONVERTER SPUR CANCELLATION

(75) Inventors: Marcel F. Schemmann, Maria Hoop (NL); Dean Painchaud, Cromwell, CT (US); Zhijian Sun, Avon, CT (US)

(73) Assignee: ARRIS Group, Inc., Suwanee, GA (US)

( * ) Notice: Subject to any disclaimer, the term of this patent is extended or adjusted under 35 U.S.C. 154(b) by 56 days.

(21) Appl. No.: 12/406,101

(22) Filed: Mar. 17, 2009

(65) Prior Publication Data

US 2009/0237285 A1 Sep. 24, 2009

Related U.S. Application Data

(60) Provisional application No. 61/069,790, filed on Mar. 17, 2008.

(51) Int. Cl.
*H03M 1/66* (2006.01)

(52) U.S. Cl. ........................................ 341/144; 375/224

(58) Field of Classification Search .......... 341/144–155; 327/554, 551
See application file for complete search history.

(56) References Cited

U.S. PATENT DOCUMENTS

| | | | | |
|---|---|---|---|---|
| 5,568,142 | A * | 10/1996 | Velazquez et al. | 341/126 |
| 6,177,893 | B1 * | 1/2001 | Velazquez et al. | 341/118 |
| 6,339,390 | B1 * | 1/2002 | Velazquez et al. | 341/120 |
| 6,473,013 | B1 * | 10/2002 | Velazquez et al. | 341/120 |
| 6,535,561 | B2 * | 3/2003 | Boesch et al. | 375/296 |
| 7,498,958 | B1 * | 3/2009 | Lee et al. | 341/61 |
| 2009/0033529 | A1 * | 2/2009 | Raz et al. | 341/120 |

* cited by examiner

*Primary Examiner* — Lam T Mai

(74) *Attorney, Agent, or Firm* — Troy A. Van Aacken; Robert J. Starr

(57) ABSTRACT

A device includes an upsampling digital-analog converter (DAC) and logic to add a DC offset to a signal input to the DAC, the logic adapted to set the DC signal to cancel a DAC output spur.

9 Claims, 2 Drawing Sheets

Signal out of DAC up-converting to a frequency fc

DIGITAL TO ANALOG CONVERTER SPUR CANCELLATION

PRIORITY CLAIM

The present application claims priority under 35 USC 119 to U.S. application No. 61/069,790 filed on Monday, Mar. 17, 2008, and which is incorporated herein by reference.

BACKGROUND

In high speed digital-analog conversion (DAC) applications, unwanted spurs often occur at divides of the DAC output frequency. Such spurs predominantly occur at power of two (so 2, 4, 8 etc) divides of the DAC output frequency. For upsampling DACs, the frequency bands that can be selected are usually a multiple of such a divide (such as an integer multiple of $\frac{1}{8}^{th}$ of the DAC output frequency).

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

Figure 1:
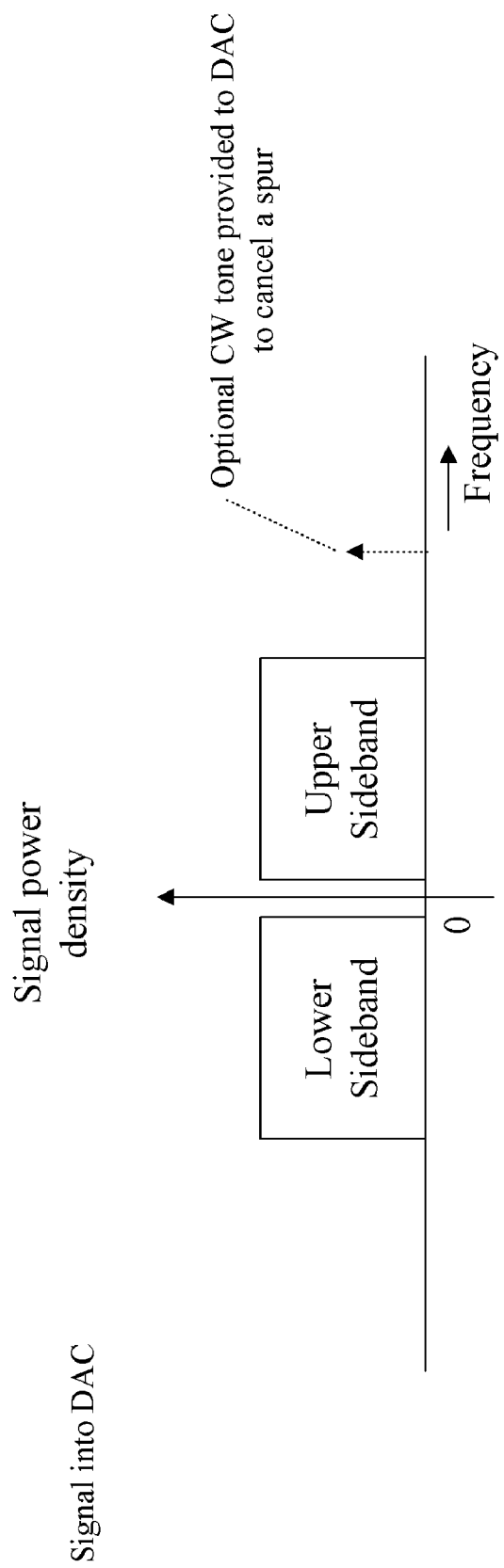
FIG. 1 illustrates an embodiment of a carrier-based input signal to a DAC.

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

"Logic" refers to signals and/or information that may be applied to influence the operation of a device. Software, hardware, and firmware are examples of logic. Hardware logic may be embodied in circuits. In general, logic may comprise combinations of software, hardware, and/or firmware.

Those skilled in the art will appreciate that logic may be distributed throughout one or more devices, and/or may be comprised of combinations of instructions in memory, processing capability, circuits, and so on. Therefore, in the interest of clarity and correctness logic may not always be distinctly illustrated in drawings of devices and systems, although it is inherently present therein.

The techniques and procedures described herein may be implemented via logic distributed in one or more computing devices. The particular distribution and choice of logic is a design decision that will vary according to implementation.

In the upsampling process, a DAC applies a complex modulation to the input signal in units, or half-units, of the divide. Thus a constant input code to the DAC may be modulated up to a constant wave (CW) tone at a multiple of the divide frequency. These tones can coincide in frequency with the unwanted spurs. Cancellation of the unwanted spurs may be achieved by controlling the tone amplitude and phase (by adjusting the real and imaginary part of the constant offset into the DAC) such that the amplitude is approximately equal to the spur amplitude and the phase is opposite.

Thus the addition of a controllable constant in the signal to a DAC with upconversion can be used to improve performance of the DAC by cancellation of those unwanted spurs that typically occur.

In an extension to this concept, the addition of a controllable signal to a DAC with unwanted output signals can in many cases be used to eliminate the unwanted signals. The added signal need not be related to the wanted signal, but in some cases could be related (such as in the case of distortion linearization by an FPGA/DAC combination discussed earlier).

The spur at frequency fc (for a DAC that upconverts to fc) can be eliminated by providing a DC offset to the codes provided to the DAC. Spurs at other frequencies can be eliminated by providing CW tones to the DAC input.

FIG. 1 illustrates an embodiment of a carrier-based input signal to a DAC. The carrier results in a power density spike; modulation of the carrier causes power in the sidebands. A CW tone is added to the input signal. The CW tone is outside the frequency band of the carrier and sidebands.

Figure 2:
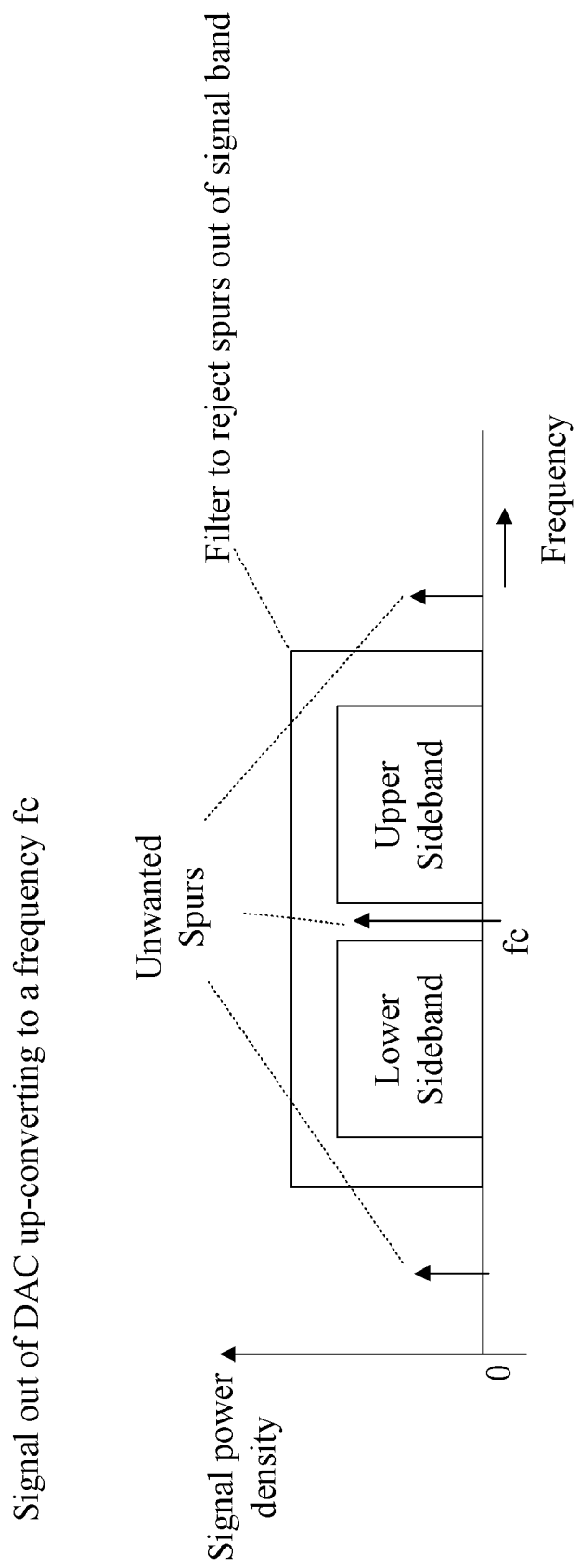
FIG. 2 illustrates an embodiment of a carrier-based output signal from a DAC.

FIG. 2 illustrates an embodiment of a carrier-based output signal from a DAC. Spurs occur at fc (the upconverted carrier frequency) and at other points outside the upsampled sidebands. The spur at fc may be eliminated by providing a DC offset to the DAC input signal. The other spurs may be eliminated either by filtering the output signal, or by adding CW tones to the DAC input signal.

Those having skill in the art will appreciate that there are various logic implementations by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A device comprising:
   an upsampling digital-analog converter (DAC); and
   logic to add a DC offset to a signal input to the DAC, the logic adapted to set the DC signal to cancel a DAC output spur.

2. The device of claim 1, further comprising:
   logic to add at least one constant-wave (CW) tone to the signal input to the DAC.

3. The device of claim 1, further comprising:
   logic to filter the DAC output of unwanted spurs.

4. A process comprising:
   determining a DC signal value that, when input to a digital-analog converter (DAC), will cancel a spur in the DAC output; and
   adding the DC offset to a signal input to the DAC.

5. The process of claim 4, further comprising:
   adding at least one constant-wave (CW) tone to the signal input to the DAC.

6. The process of claim 4, further comprising:
   filtering the DAC output of unwanted spurs.

7. A device comprising:
   an upsampling digital-analog converter (DAC); and
   logic to add at least one constant-wave (CW) tone to the signal input to the DAC, the logic adapted to set the CW tone to cancel a DAC output spur.

8. The device of claim 7, further comprising:
   logic to add a DC offset to the signal input to the DAC, the logic adapted to set the DC signal to cancel a DAC output spur.

9. The device of claim 7, further comprising:
   logic to filter the DAC output of unwanted spurs.

* * * * *